(12) United States Patent
Yanoh et al.

(10) Patent No.: US 11,476,147 B2
(45) Date of Patent: Oct. 18, 2022

(54) WAFER HOLDING TABLE

(71) Applicant: NGK INSULATORS, LTD., Nagoya (JP)

(72) Inventors: Takuya Yanoh, San Jose, CA (US); Kengo Torii, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 17/015,371

(22) Filed: Sep. 9, 2020

(65) Prior Publication Data

US 2021/0043491 A1 Feb. 11, 2021

Related U.S. Application Data

(63) Continuation of application No. PCT/JP2019/007617, filed on Feb. 27, 2019.

(30) Foreign Application Priority Data

Mar. 13, 2018 (JP) .............................. JP2018-045172

(51) Int. Cl.
*H01L 21/683* (2006.01)
(52) U.S. Cl.
CPC ................................ *H01L 21/6833* (2013.01)
(58) Field of Classification Search
CPC ........... H01L 21/6833; H01L 21/67103; H01L 21/67109; H01L 21/6831; H01L 21/68785;

(Continued)

(56) References Cited

U.S. PATENT DOCUMENTS 6,256,187 B1 * 7/2001 Matsunaga .............. B23Q 3/00
429/208
9,330,953 B2 * 5/2016 Miura .................. H01L 21/6831
(Continued)

FOREIGN PATENT DOCUMENTS

JP 2000-114358 A1 4/2000
JP 2007-110023 A1 4/2007
(Continued)

OTHER PUBLICATIONS

English translation of International Preliminary Report on Patentability (Chapter I) (Application No. PCT/JP2019/007617) dated Sep. 24, 2020, 7 pages.
(Continued)

*Primary Examiner* — Thienvu V Tran
*Assistant Examiner* — Sreeya Sreevatsa
(74) *Attorney, Agent, or Firm* — Burr & Brown, PLLC

(57) ABSTRACT

A wafer holding table includes a ceramic electrostatic chuck, a metal cooling plate, a resin layer having predetermined thermal resistance, and a stress relaxation layer having lower Young's modulus than the resin layer. The resin layer and the stress relaxation layer are disposed between the electrostatic chuck and the cooling plate. The resin layer is disposed closer to the electrostatic chuck, and the stress relaxation layer is disposed closer to the cooling plate. The resin layer has a multilayer structure including a plurality of resin sheets laminated one on another. The resin layer is thinner than a comparative sample with a single-layer structure made of a material identical to a material of the resin sheet and having thermal resistance identical to thermal resistance of the resin layer.

3 Claims, 7 Drawing Sheets

(58) Field of Classification Search
CPC .. H01L 21/68757; H02H 3/093; H02H 3/021; H02H 3/025; H02H 7/222; G01R 15/181; G01R 19/16571; G01R 31/52; G01R 31/40; G01R 31/3277; G01R 31/3275; H03K 17/0822; B23Q 3/15; H02N 13/00
USPC .................................................. 361/234, 93.9
See application file for complete search history.

(56) References Cited

U.S. PATENT DOCUMENTS

| | | | | |
|---|---|---|---|---|
| 2011/0058303 | A1* | 3/2011 | Migita | H01L 21/6833 156/60 |
| 2013/0148253 | A1* | 6/2013 | Komatsu | H01L 21/67103 361/234 |
| 2014/0272421 | A1 | 9/2014 | Ohba et al. | |
| 2016/0196999 | A1* | 7/2016 | Yanoh | H01L 21/6833 361/234 |

FOREIGN PATENT DOCUMENTS

| | | | |
|---|---|---|---|
| JP | 2007110023 A | * | 4/2007 |
| JP | 2013-120835 A1 | | 6/2013 |
| JP | 2014-183077 A1 | | 9/2014 |
| JP | 2016-092215 A1 | | 5/2016 |
| JP | 2016092215 A | * | 5/2016 |
| JP | 5948513 | | 7/2016 |
| KR | 10-2016-0088426 A | | 7/2016 |
| TW | 1540674 B | * | 7/2016 |

OTHER PUBLICATIONS

International Search Report and Written Opinion (Application No. PCT/JP2019/007617) dated Apr. 23, 2019.
Korean Office Action (with English translation), Korean Application No. 10-2020-7025647, dated Jan. 5, 2022 (8 pages).

* cited by examiner

Fig. 1
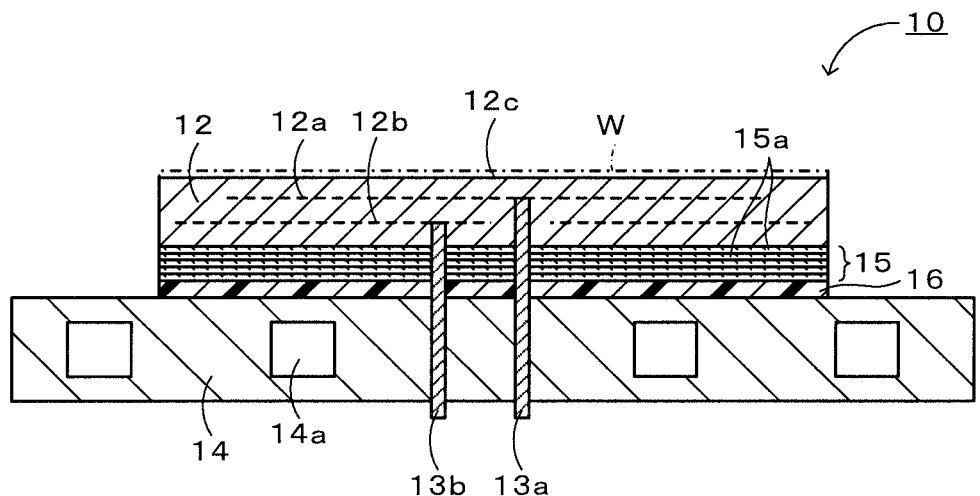
Fig. 2A                     Fig. 2B
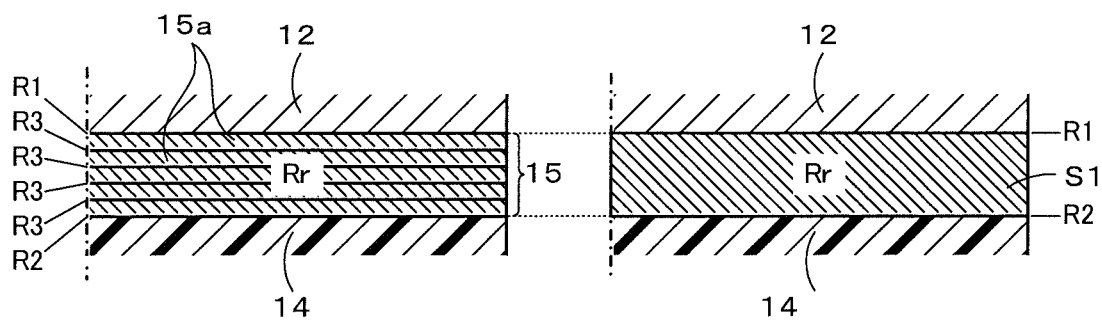
Rm(=Rr+R1+R2+ΣR3) > Rs1(=Rr+R1+R2)

$Rm (= Rr + R1 + R2 + \Sigma R3) = Rs2 (= Rr' + R1 + R2)$

Fig. 9

| Number of sheet of resin layer *1 | Stress distribution *2,*3 | Maximum stress in the entire resin layer [MPa] | Maximum stress at interface between alumina disk and resin layer [MPa] |
|---|---|---|---|
| 1 | | 19.6 | 19.6 |
| 3 | | 19.2 | 5.41 |
| 5 | | 21.0 | 4.82 |
| 7 | | 20.6 | 4.78 |
| 9 | | 20.6 | 4.79 |

*1 All resin layers have thickness of 0.5 mm (uniform).
*2 Arrows indicate maximum stress occurrence portions.
*3 As illustrated below, stress distribution was measured at output portion defined by dotted rectangle for each virtual sample (radius of 150 mm) including alumina disk and aluminum disk bonded with resin layer.

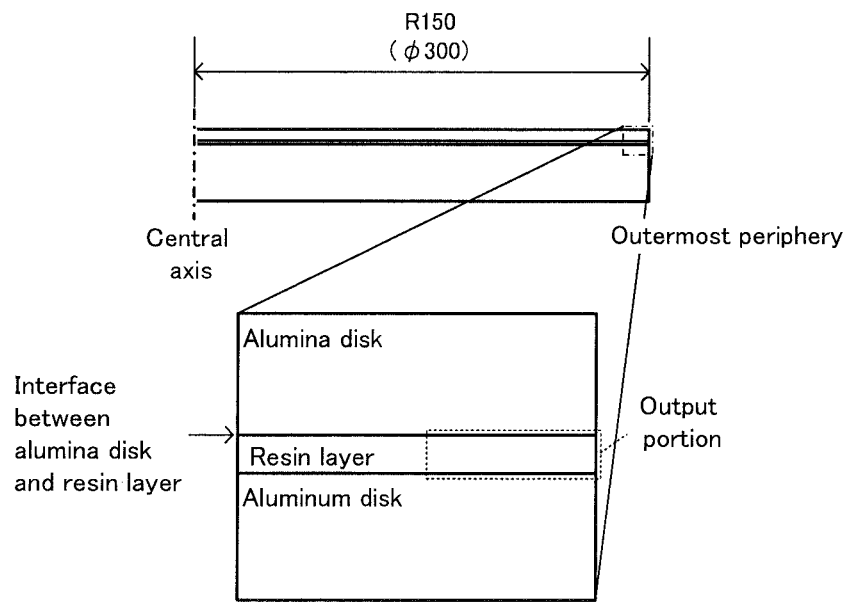

WAFER HOLDING TABLE

BACKGROUND OF THE INVENTION

1. Field of the Invention

The present invention relates to a wafer holding table.

2. Description of the Related Art

A wafer holding table including a resin layer and a stress relaxation layer between a ceramic electrostatic chuck and a metal cooling plate is known thus far. For example, a wafer holding table described in PTL 1 includes a first layer and an intermediate layer, serving as resin layers, and a second layer, serving as a stress relaxation layer. The first layer is in contact with the electrostatic chuck, the second layer is in contact with the cooling plate, and the intermediate layer is disposed between the first layer and the second layer. The first layer and the intermediate layer have higher heat resistance than the second layer. The second layer has higher flexibility than the first layer and the intermediate layer.

CITATION LIST

Patent Literature

PTL 1: Japanese Patent No. 5948513

SUMMARY OF THE INVENTION

PTL 1, which is not made taking the thickness of the first layer and the intermediate layer into consideration, may have an excessively thick resin layer. The excessively thick resin layer increases the difference between the maximum thickness and the minimum thickness of the resin layer. In this case, the heat of the wafer is less easily transmitted to the cooling plate at the portion of the resin layer having a maximum thickness, whereas the heat of the wafer is more easily transmitted to the cooling plate at the portion of the resin layer having a minimum thickness. Thus, the wafer has larger temperature variation as the difference between the maximum thickness and the minimum thickness of the resin layer increases further.

The present invention has been made to solve the above problem, and mainly aims to reduce temperature variation of a wafer using a structure between an electrostatic chuck and a cooling plate.

A wafer holding table according to the present invention includes a ceramic electrostatic chuck, a metal cooling plate, a resin layer having predetermined thermal resistance, and a stress relaxation layer having lower Young's modulus than the resin layer, the resin layer and the stress relaxation layer being disposed between the electrostatic chuck and the cooling plate, the resin layer being disposed closer to the electrostatic chuck, and the stress relaxation layer being disposed closer to the cooling plate, wherein the resin layer has a multilayer structure formed by laminating a plurality of resin sheets one on another, and the resin layer is thinner than a comparative sample with a single-layer structure made of a material identical to a material of the resin sheet and having thermal resistance identical to thermal resistance of the resin layer.

In this wafer holding table, a resin layer has thermal resistance higher by interface resistance between resin sheets than a first resin sample with a single-layer structure manufactured by the same material as the resin layer and having the same thickness as the resin layer. Thus, the resin layer can be made thinner than a second resin sample (comparative sample) with a single-layer structure manufactured by the same material as the resin layer and having the same heat resistance as the resin layer. Specifically, a resin layer between an electrostatic chuck and a cooling plate has such a multilayer structure. The resin layer with the multilayer structure can be made thinner than the comparative sample with a single-layer structure, and can reduce the difference between the maximum thickness and the minimum thickness of the resin layer. Thus, the temperature variation of a wafer can be reduced.

In a wafer holding table according to the present invention, a side surface of the resin layer may be recessed at a middle in a thickness direction or may have a stepped shape in the thickness direction, when the side surface is viewed in the thickness direction. Such a structure can reduce maximum stress at the interface between the electrostatic chuck and the resin layer. Thus, the electrostatic chuck and the resin layer are less likely to be detached from each other.

Preferably, the resin layer has a multilayer structure including three or more resin sheets laminated one on another. This structure can fully reduce the maximum stress at the interface between the electrostatic chuck and the resin layer. Preferably, the resin layer has a multilayer structure including five or more resin sheets laminated one on another. This structure can almost minimize the maximum stress at the interface between the electrostatic chuck and the resin layer.

A method for manufacturing wafer holding tables according to the present invention includes (a) a step of pressing and heating a laminate obtained by laminating multiple identical resin sheets on a surface of a ceramic electrostatic chuck opposite to a wafer placement surface to fuse the multiple resin sheets to the electrostatic chuck to form a resin layer with a multilayer structure, (b) a step of bonding a stress relaxation layer on one surface of a metal cooling plate, and (c) a step of pressing and heating the resin layer of the electrostatic chuck and the stress relaxation layer of the cooling plate in contact with each other to obtain any of the above-described wafer holding tables.

In step (a), an electrostatic chuck including a resin layer with a multilayer structure bonded to a surface opposite to the wafer placement surface is obtained. Even when laminated into a multilayered structure, the resin sheets, which are thin, easily follow the shape of the surface of the electrostatic chuck and thus easily let go of bubbles between bonded surfaces of the sheets. Thus, the resin layer can have small flatness, and the sheets can be hermetically bonded to each other. In addition, the thermal resistance of the resin layer can be easily adjusted by changing the number of resin sheets. The resin layer, which is obtained by curing the resin sheets, has scarcely any adhesiveness. In step (b), a cooling plate having one surface to which the stress relaxation layer is bonded is obtained. In step (c), the resin layer of the electrostatic chuck and the stress relaxation layer of the cooling plate in contact with each other are pressed and heated. Here, the stress relaxation layer is fused to the resin layer, so that the resin layer and the stress relaxation layer are bonded together. Thus, a wafer holding table is obtained. Steps (a) to (c) may be collectively performed.

In a method for manufacturing a wafer holding table according to the present invention, when the wafer holding table has a disk shape, in order for a side surface of the resin layer to be recessed at a middle in a thickness direction when the side surface is viewed in the thickness direction, the resin sheets may be arranged in step (a) so that the resin sheet having a smallest diameter is arranged in a middle in the thickness direction and diameters of the resin sheets increase from the middle toward end portions in the thickness direction. In order for a side surface of the resin layer to have a stepped shape when the side surface is viewed in the thickness direction, the resin sheets may be arranged in step (a) so that diameters of the resin sheets decrease stepwise.

BRIEF DESCRIPTION OF THE DRAWINGS

FIG. 1 is a cross-sectional view of a wafer holding table 10.

FIGS. 2A and 2B illustrate a resin layer 15 and a first resin sample S1 in comparison.

FIG. 9 shows results of stress distribution measurement.

DETAILED DESCRIPTION OF THE INVENTION

First Embodiment

Figure 3:
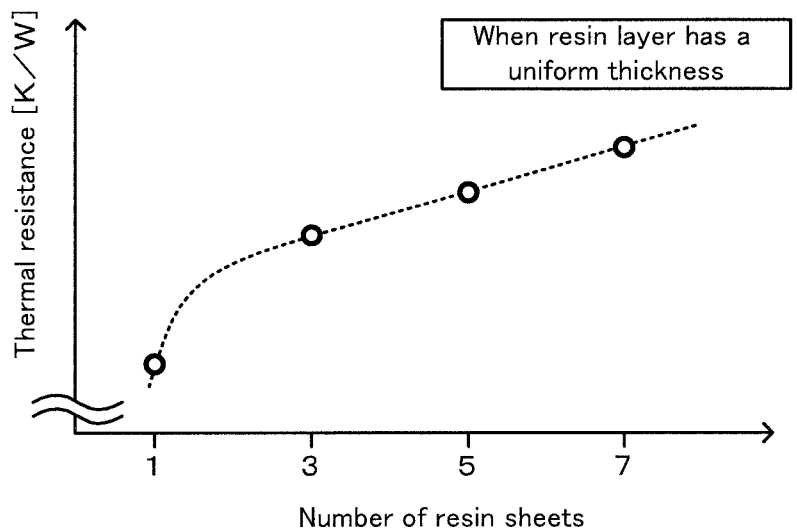
FIG. 3 is a graph showing the relationship between the number of resin sheets and thermal resistance.
Figure 4A:
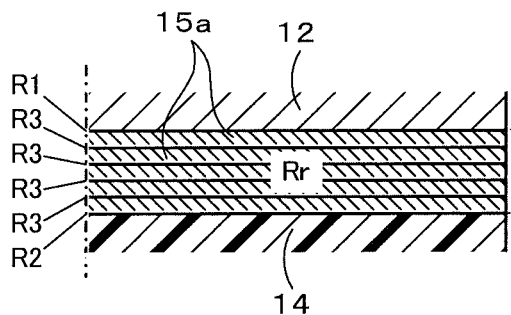
FIGS. 4A and 4B illustrate the resin layer 15 and a second resin sample S2 in comparison.
Figure 4B:
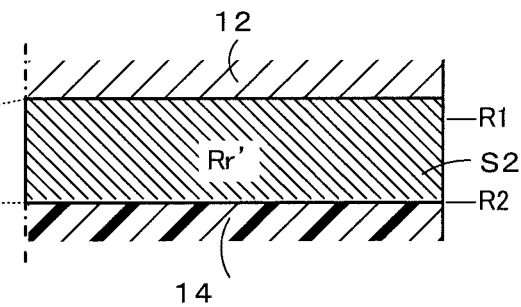

FIG. 1 is a cross-sectional view of a wafer holding table 10 according to a first embodiment, FIGS. 2A and 2B illustrate a resin layer 15 and a first resin sample S1 in comparison, FIG. 3 is a graph showing the relationship between the number of resin sheets and thermal resistance, and FIGS. 4A and 4B illustrate the resin layer 15 and a second resin sample S2 in comparison.

As illustrated in FIG. 1, the wafer holding table 10 includes a resin layer 15 and a stress relaxation layer 16 between a ceramic electrostatic chuck 12 and a metal cooling plate 14. The resin layer 15 mainly has a function of obtaining a predetermined thermal resistance, and the stress relaxation layer 16 mainly has a function of relaxation stress caused by the difference in thermal expansion between the electrostatic chuck 12 and the cooling plate 14.

Examples usable as the electrostatic chuck 12 include a known chuck including a circular ceramic board made of alumina or an aluminum nitride in which an electrostatic electrode 12a and a heater electrode 12b are incorporated. The electrostatic electrode 12a receives power from the outside via a feeder member 13a, which extends through the resin layer 15, the stress relaxation layer 16, and the cooling plate 14. The heater electrode 12b receives power from the outside via a feeder member 13b, which extends through the resin layer 15, the stress relaxation layer 16, and the cooling plate 14. The feeder members 13a and 13b are electrically insulated from the cooling plate 14. The upper surface of the electrostatic chuck 12 is a wafer placement surface 12c. A wafer W placed on the wafer placement surface 12c is attracted to and held on the surface with electrostatic force of the electrostatic electrode 12a, and heated with the heater electrode 12b.

Examples usable as the cooling plate 14 include a known plate including a coolant passage 14a that allows a coolant such as a liquid coolant to circulate therethrough. The cooling plate 14 is formed from a disk made of thermally conductive material, for example, metal such as aluminum or an aluminum alloy. The cooling plate 14 has the coolant passage 14a installed therein. Thus, the cooling plate 14 is kept at a low temperature by a coolant (such as a liquid coolant) also when the electrostatic chuck 12 has a high temperature.

The resin layer 15 is disposed between the electrostatic chuck 12 and the cooling plate 14, and closer to the electrostatic chuck 12. The electrostatic chuck 12 normally has higher temperature than the cooling plate 14. Thus, the resin layer 15 is made of a material having higher heat resistance than the stress relaxation layer 16. The resin layer 15 has a multilayer structure including a laminate of multiple resin sheets 15a made of the same material and having the same thickness. The resin sheets 15a are preferably polyimide-based resin layers, epoxy-based resin layers, or polyether-ether-ketone (PEEK) resin layers, which are resistant to heat at 200° C. (preferably 250° C.) This is because the temperature of the resin layer 15 may be raised up to this temperature with a heat transfer from the electrostatic chuck 12. The polyimide-based resin layer is a resin layer containing a polymer material including at least imide bond. The epoxy-based resin layer is a resin layer containing a three-dimensional cured body resulting from reaction between a curing agent and a prepolymer containing a reactive epoxy group. Examples usable as a prepolymer include a prepolymer that enables hydrogen transfer polymerization. Preferably, the resin sheets 15a constituting the resin layer 15 are hermetically in contact with each other. Here, being hermetically in contact with each other refers to the state where no bubble of larger than or equal to 1 mm is interposed between layers with 20 or fewer bubbles of smaller than $\phi$1 mm per 706.5 cm$^2$. For example, when the resin layer 15 is visible through the upper surface of the electrostatic chuck 12, the presence or absence of bubbles may be visibly checked. Alternatively, the presence or absence of bubbles may be examined with an ultrasonic flaw detector.

The thermal resistance Rm [K/W] of the resin layer 15 is determined to be a predetermined thermal resistance. The thermal resistance Rm of the resin layer 15 is expressed in formula (1), below. In Formula (1), Rr denotes thermal resistance of resin of the multiple resin sheets 15a constituting the resin layer 15, R1 denotes the interface resistance between the resin layer 15 and the electrostatic chuck 12, R2 denotes the interface resistance between the resin layer 15 and the stress relaxation layer 16, and R3 denotes the interface resistance between resin sheets 15a in contact with each other (refer to FIG. 2A or FIG. 4A). ΣR3 is the sum of the interface resistances R3, and the product obtained by multiplying the interface resistance R3 by the number obtained by subtracting one from the number of the resin sheets 15a:

$$Rm=Rr+R1+R2+\Sigma R3 \qquad (1).$$

When the resin layer 15 has a uniform thickness, the thermal resistance of the resin layer 15 increases as the number of the resin sheets 15a constituting the resin layer 15 increases (refer to FIG. 3). This is because ΣR3 in Formula (1) increases with the number of resin sheets 15a.

The following describes thermal resistance Rs1 of the first resin sample S1 (refer to FIG. 2B) with a single-layer structure made of the same material as the resin sheets 15a and having the same thickness as the resin layer 15. The thermal resistance Rs1 is expressed in Formula (2), below. In Formula (2), Rr denotes thermal resistance (same as thermal resistance of resin of the resin layer 15) of resin of the first resin sample S1, and R1 and R2 are similar to those described in Formula (1). Formulas (1) and (2) show that the thermal resistance Rm of the resin layer 15 is higher than the thermal resistance Rs1 of the first resin sample S1 by ΣR3:

$$Rs1=Rr+R1+R2 \quad (2).$$

The following describes thermal resistance Rs2 of the second resin sample S2 (refer to FIG. 4B) with a single-layer structure made of the same material as the resin sheets 15a and having the same thermal resistance Rm as the resin layer 15. The thermal resistance Rs2 is represented as Formula (3), below. In Formula (3), Rr' denotes thermal resistance of resin of the second resin sample S2, and R1 and R2 are similar to those described in Formula (1). The thermal resistance Rs2 is the same as the thermal resistance Rm, and Rr' is expressed in Formula (4), below. The thermal resistance of resin depends on the thickness of the resin. Formula (4) shows that the second resin sample S2 is thicker than the resin layer 15. In other words, the resin layer 15 is thinner than the second resin sample S2. The second resin sample S2 corresponds to "a comparative sample" in the present invention:

$$Rs2=Rr'+R1+R2 \quad (3); \text{ and}$$

$$Rr'=Rr+\Sigma R3 \quad (4).$$

The stress relaxation layer 16 is disposed between the electrostatic chuck 12 and the cooling plate 14, closer to the cooling plate 14. The cooling plate 14 normally has a lower temperature than the electrostatic chuck 12. Thus, the stress relaxation layer 16 is not required to have heat resistance as high as that of the resin layer 15, but instead, made of a material having lower Young's modulus (material having higher flexibility) than the resin layer 15. Thus, the stress relaxation layer 16 relieves stress caused by the difference in thermal expansion between the electrostatic chuck 12 and the cooling plate 14. Preferably, the stress relaxation layer 16 is hermetically in contact with the resin layer 15. The degree of hermetic contact or how to determine the degree are similar to those described for the resin layer 15. Preferably, the stress relaxation layer 16 is an epoxy/acrylic composite resin layer. For example, an epoxy/acrylic composite resin layer disclosed in Japanese Unexamined Patent Application No. 2014-183077 is usable for the epoxy/acrylic composite resin layer. The stress relaxation layer 16 mainly has a function of relaxing stress caused by the difference in thermal expansion between the electrostatic chuck 12 and the cooling plate 14, and is preferably a single layer with a thickness of 0.1 to 0.4 mm. A single layer is a layer without a border separating two layers. Preferably, the stress relaxation layer 16 is a single layer obtained by laminating multiple sheets, which serve as a precursor of the stress relaxation layer 16.

Figure 5:
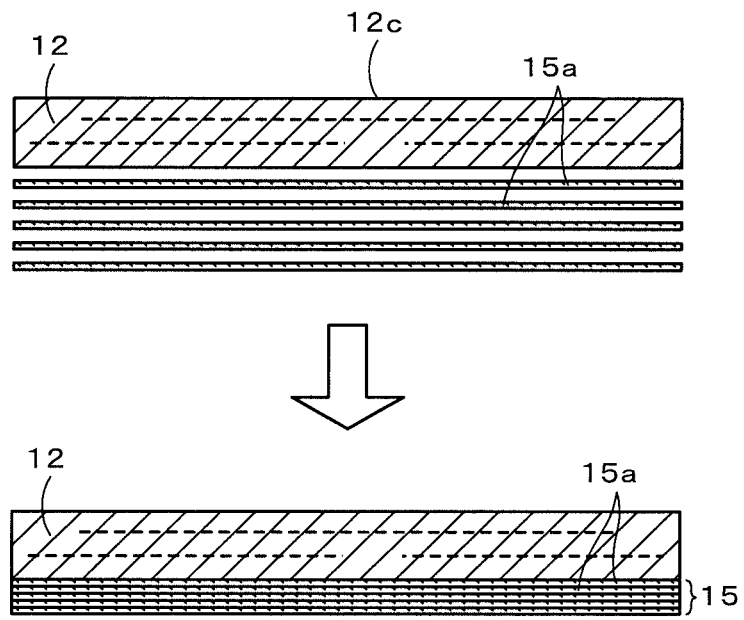
FIG. 5 illustrates a process for manufacturing the wafer holding table 10.
Figure 6:
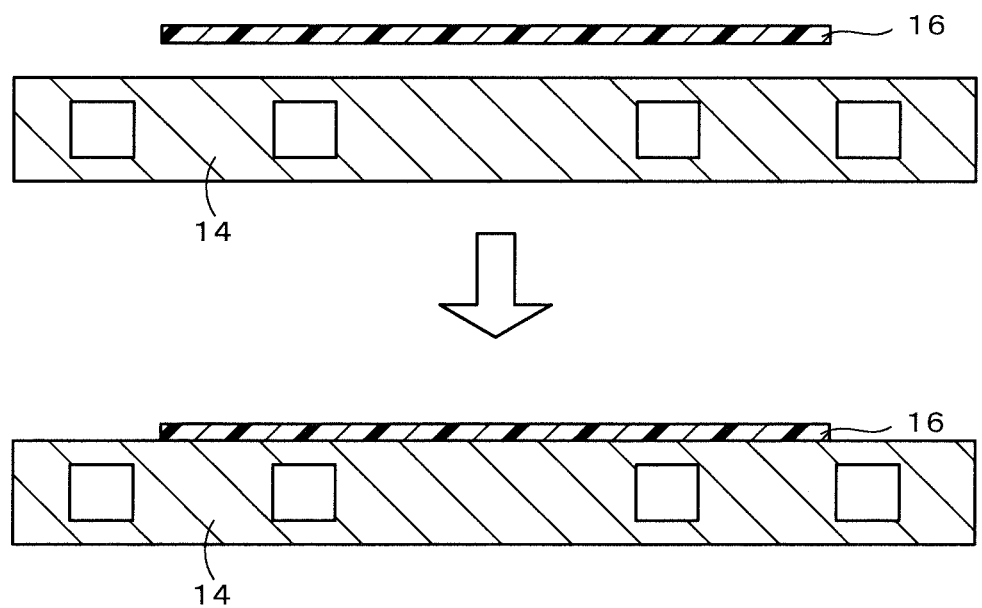
FIG. 6 illustrates a process for manufacturing the wafer holding table 10.
Figure 7:
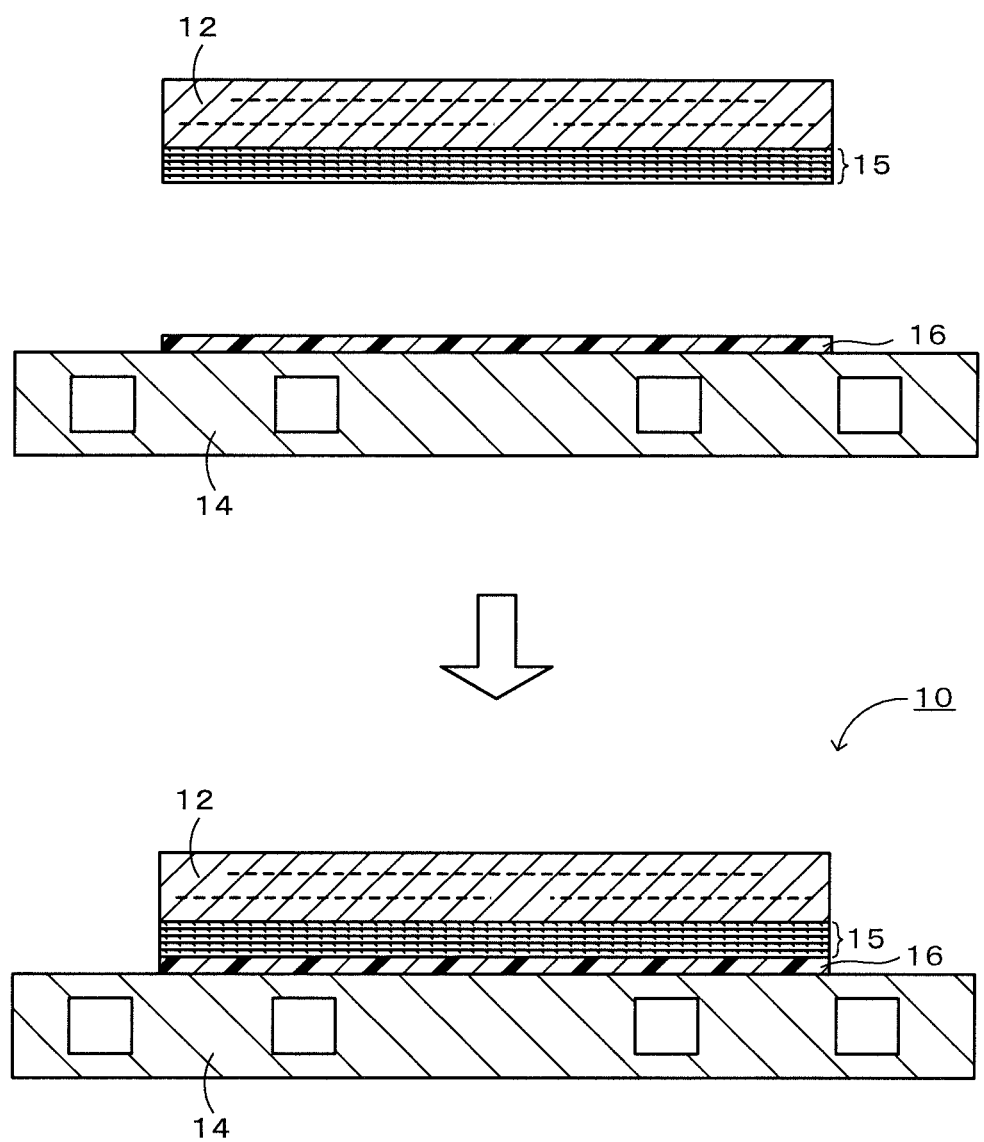
FIG. 7 illustrates a process for manufacturing the wafer holding table 10.

Now, an example of a method for manufacturing the above wafer holding table 10 will be described. Here, the feeder members 13a and 13b are not described for convenience' sake. FIG. 5 to FIG. 7 illustrate the method for manufacturing the wafer holding table 10 (illustrate the manufacturing process).

First, as illustrated in FIG. 5, the multiple resin sheets 15a are laminated on the surface of the electrostatic chuck 12 opposite to the wafer placement surface 12c. Here, the resin sheets 15a, which are thin, easily follow the shape of the surface opposite to the wafer placement surface 12c, and easily let go of the bubbles between the sheets. Subsequently, the resin sheets 15a are heated while being pressed in the direction in which they are in tight contact with each other to be fused to the electrostatic chuck 12 and to be fused to each other, and then left to be cooled. The multiple resin sheets 15a are heated and pressed, for example, while the electrostatic chuck 12 on which the multiple resin sheets 15a are laminated one on another is placed in a bag, and the bag is decompressed. The bag is then placed in an autoclave to be heated while being pressed. The pressure for pressing preferably falls within a range of 0.1 to 5.0 MPa, and the temperature for heating preferably falls within a range of 150 to 350° C. Thus, the electrostatic chuck 12 to which the resin layer 15 is fixed is obtained. The cooled resin layer 15 has scarcely any adhesiveness. As illustrated in FIG. 6, the stress relaxation layer 16 with a normal temperature is bonded to one surface of the cooling plate 14. Thus, the cooling plate 14 to which the stress relaxation layer 16 is bonded is obtained. Then, as illustrated in FIG. 7, the resin layer 15 fixed to the electrostatic chuck 12 and the stress relaxation layer 16 bonded to the cooling plate 14 are superposed to be integrated into a unit, and heated while being pressed in the direction in which they come in tight contact with each other. Thus, the stress relaxation layer 16 is fused to the resin layer 15. Thereafter, the integrated unit is cooled. The integrated unit is heated and pressed, for example, while placed in a bag, and the bag is decompressed. The bag is then placed in an autoclave to be heated while being pressed. The pressure for pressing preferably falls within a range of 0.1 to 1.0 MPa, and the temperature for heating preferably falls within a range of 100 to 170° C. Thus, the wafer holding table 10 is obtained.

Steps illustrated in FIG. 5 and FIG. 6 may be collectively performed. In this case, the electrostatic chuck 12, the resin sheets 15a, the stress relaxation layer 16, and the cooling plate 14 are placed in a bag, the bag is decompressed, and the bag is placed into an autoclave to be heated and pressed. Thus, the wafer holding table 10 is obtained.

In the above-described wafer holding table 10, the thermal resistance Rm of the resin layer 15 is further increased by the interface resistance R3 (ΣR3) between the resin sheets 15a than the thermal resistance Rs1 of the first resin sample S1 made of the same material as the resin layer 15 and having the same thickness as the resin layer 15 (refer to FIGS. 2A and 2B). Thus, the resin layer 15 can be made thinner than the second resin sample S2 according to a comparative sample with a single-layer structure made of the same material as the resin layer 15 and having the same thermal resistance as the resin layer 15 (refer to FIGS. 4A and 4B). Specifically, the resin layer 15 disposed between the electrostatic chuck 12 and the cooling plate 14 has a multilayer structure, and thus can be made thinner than the second resin sample S2, so that the difference between the maximum thickness and the minimum thickness of the resin layer 15 can be reduced. Thus, the temperature variation of the wafer W can be reduced.

With the method for manufacturing the wafer holding table 10 illustrated in FIG. 5 to FIG. 7, the resin sheets 15a, which are thin, easily follow the shape of the surface of the electrostatic chuck 12 even laminated to form a multilayer structure, and thus easily let go of bubbles between bonded surfaces of the sheets. Thus, the resin layer 15 can have small flatness, and the sheets can be hermetically bonded to each other. In addition, the thermal resistance of the resin layer 15 can be easily adjusted by changing the number of resin sheets 15a.

Second Embodiment

Figure 8:
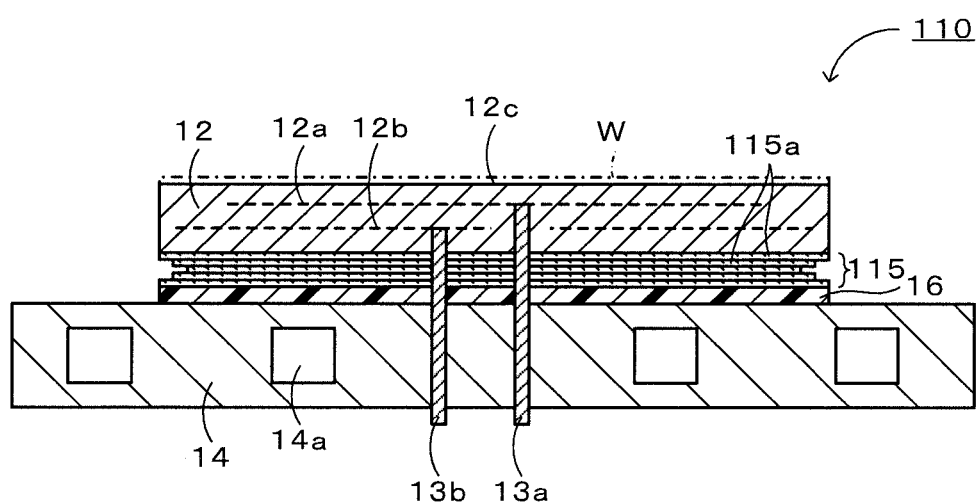
FIG. 8 is a cross-sectional view of a wafer holding table 110.

FIG. 8 is a cross-sectional view of a wafer holding table 110 according to a second embodiment.

As illustrated in FIG. 8, the wafer holding table 110 includes a resin layer 115 and a stress relaxation layer 16 between the ceramic electrostatic chuck 12 and the metal cooling plate 14. The electrostatic chuck 12, the cooling plate 14, and the stress relaxation layer 16 are the same as those according to the first embodiment, and thus are not described, here.

The resin layer 115 is the same as the resin layer 15 according to the first embodiment except that the side surface of the resin layer 115 is recessed at the middle in the thickness direction when the side surface is viewed in the thickness direction. In the case, for example, where the resin layer 115 has a multilayer structure including five resin sheets 115a having the same thickness laminated one on another, the first resin layer 115a from the top (closest to the electrostatic chuck 12) has the same diameter as the electrostatic chuck 12, the second resin sheet 115a from the top has a diameter slightly smaller than that of the electrostatic chuck 12, the third resin sheet 115a from the top, that is, the middle resin sheet 115a has a further smaller diameter than the electrostatic chuck 12, the fourth resin sheet 115a from the top has the same diameter as the second resin sheet 115a from the top, and the fifth resin sheet 115a from the top (closest to the stress relaxation layer 16) has the same diameter as the first resin sheet 115a from the top. These resin sheets 115a are all made of the same material, and the material is the same as that for the resin sheets 15a according to the first embodiment. The resin layer 115 is thinner than a comparative sample having a single-layer structure made of the same material as the resin sheets 115a and having the same thermal resistance as the resin layer 115. The reason for this is as described in the first embodiment.

FIG. 9 shows the results of a stress analysis performed while changing the number of resin sheets constituting the resin layer between one, three, five, seven, and nine without changing the thickness of the resin layer from 0.5 mm (uniform). In this stress analysis, virtual samples with simpler structures are used instead of a wafer holding table structure. As illustrated in FIG. 9, virtual samples are formed by bonding an alumina disk and an aluminum disk with a radius of 150 mm with a resin layer. In the stress analysis, stress distribution caused when the alumina disk and the aluminum disk, which are bonded with the resin sheets at 300° C., are cooled to 25° C. is measured. In the stress distribution, an output portion defined by a dotted rectangle was measured. When three or more resin sheets are used, the radius (radius in the recess) of the resin sheet located at the middle in the thickness direction of the resin layer is determined as 149.2 mm.

Table in FIG. 9 shows the results of the stress distribution measurement. When the resin layer is a single layer (that is, one sheet), a portion in the entire resin layer that has the maximum stress is the outer edge of the interface between the alumina disk and the resin layer, and the maximum stress is 19.6 MPa. When such a large stress occurs at the outer edge of the interface between the alumina disk and the resin layer, separation is more likely to occur at the interface, which is not desirable. On the other hand, in the case of a resin layer having a multilayer structure (that is, including three or more sheets), the maximum stress occurs at the recessed portion at the middle in the thickness direction, instead of the interface between the alumina disk and the resin layer, and the maximum stress falls within the range of 19.2 to 21.0 MPa. The maximum stress at the interface between the alumina disk and the resin layer falls within the range of 4.78 to 5.41 MPa, which is far smaller than that in the case where the resin layer has a single layer structure. Thus, it is found that separation is less likely to occur at the interface between the alumina disk and the resin layer when the resin layer is constituted of three or more resin sheets. Particularly, when the resin layer is constituted of five or more sheets, the maximum stress at the interface between the alumina disk and the resin layer is approximately 4.8 MPa, which is the minimum value, and thus more preferable.

As in the case of the above-described first embodiment, in the above-described wafer holding table 110, the resin layer 115 can be made thinner than a comparative sample (a sample with a single-layer structure made of the same material as the resin layer 115 and having the same thermal resistance as the resin layer 115), and thus the difference between the maximum thickness and the minimum thickness of the resin layer 115 can be reduced. Thus, the temperature variation of the wafer W can be reduced.

As in the case of the above-described first embodiment, the resin sheets 115a are thin, and thus easily follow the shape of the surface of the electrostatic chuck 12 even when laminated to form a multilayer structure, and thus easily let go of bubbles between bonded surfaces of the sheets. Thus, the resin layer 115 can have small flatness, and the sheets can be hermetically bonded to each other. In addition, the thermal resistance of the resin layer 115 can be easily adjusted by changing the number of resin sheets 115a.

The resin layer 115 has a side surface recessed at a middle in a thickness direction, when the side surface is viewed in the thickness direction. Such a structure can reduce maximum stress at the interface between the electrostatic chuck 12 and the resin layer 115. Thus, the electrostatic chuck 12 and the resin layer 115 are less likely to be detached from each other. Particularly, when the resin layer 115 is constituted of three or more resin sheets 115a, the above-described maximum stress at the interface can be fully reduced, and is thus preferable. In the structure including five or more resin sheets, the maximum stress at the interface can be almost minimized, and thus such a structure is preferable.

The present invention is not limited to the embodiments described above. It will be appreciated that the present invention can be embodied in various forms so long as they fall within the technical scope of the invention.

For example, in the above-described embodiment, the multiple resin sheets 15a have the same thickness by way of example. However, the structure is not particularly limited to this, and at least one of the multiple resin sheets may have a different thickness. The same holds true for the multiple resin sheets 115a.

In the above-described wafer holding table 10, the electrostatic chuck 12 includes the electrostatic electrode 12a and the heater electrode 12b embedded. The wafer holding table 10 may additionally include an RF electrode embedded.

Figure 10:
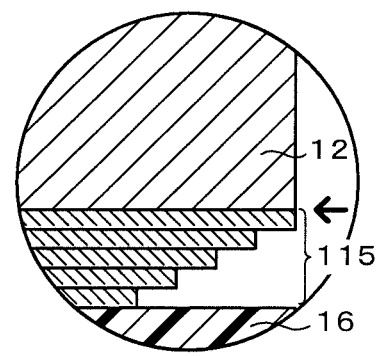
FIG. 10 is a cross-sectional view of a resin layer 115 according to another example.

In the above-described wafer holding table 10, the resin layer 115 has a side surface recessed at the middle in the thickness direction when the side surface is viewed in the thickness direction. However, as illustrated in FIG. 10, the resin layer 115 may have a side surface having a stepped shape when the side surface is viewed in the thickness direction. Also in this case, the wafer holding table 10 can reduce the maximum stress at the interface between the electrostatic chuck 12 and the resin layer 115 (portion indicated with arrow in FIG. 10).

Examples

Five heat-resistant resin sheets (polyimide-based, epoxy-based, or PEEK) having a shear strength of higher than or equal to 0.3 MPa at 250° C. or 200° C. and having a diameter of 300 mm and a thickness of 50 μm are laminated on an electrostatic chuck with a diameter of 300 mm and a thickness of 4 to 5 mm to form a laminate. The number of heat-resistant resin sheets or thickness are determined so that a finally obtained resin layer with a multilayer structure has predetermined thermal resistance. This laminate is wrapped with a cloth having high heat resistance. This is placed in a resin-made bagging, and the inside of the bagging is evacuated. The evacuated bagging is placed in an autoclave to be subjected to bonding at 300° C. and 1.0 MPa. Thus, the heat-resistant resin sheet is fused to the electrostatic chuck, and concurrently, the heat-resistant resin sheets are fused to each other to form the electrostatic chuck on which the resin layer with a multilayer structure is laminated. After being cooled, the resultant is taken out from the bagging. The resin layer has scarcely any adhesiveness.

Subsequently, an uncured and easily deformable adhesive sheet, which is a precursor of a stress relaxation layer, is bonded to an aluminum cooling plate having a diameter of 300 mm and including a cooling water conduit. Here, an example used as an adhesive sheet here contains a bisphenol A epoxy resin of 36% by mass, acrylic rubber containing a carboxyl group of 60% by mass, the acrylic rubber containing butyl acrylate as a main component and, an amine-based curing agent of 4% by mass.

Subsequently, the electrostatic chuck on which the resin layer with a multilayer structure is laminated and the cooling plate to which the adhesive sheet is bonded are superposed while bringing the resin layer and the adhesive sheet into contact with each other to form an integrated unit, and this integrated unit is wrapped with a cloth having high heat resistance. This is placed in a resin-made bagging, and the inside of the bagging is evacuated. The evacuated bagging is placed in an autoclave to be subjected to bonding at 170° C. and 0.6 MPa, and then left to be cooled. Thus, a wafer holding table including the resin layer on the electrostatic chuck bonded to the cooling plate with the stress relaxation layer interposed therebetween is obtained. The resin layer of the obtained wafer holding table is thinner than a comparative sample with the single-layer structure made of the same material as the resin layer and having the same thermal resistance as the resin layer. The wafer holding table corresponds to the wafer holding table according to the first embodiment.

Besides, two large-sized heat-resistant resin sheets with a diameter of 300 mm and a thickness of 50 μm, two medium-sized heat-resistant resin sheets with a diameter of 299.2 mm and a thickness of 50 μm, and one small-sized heat-resistant resin sheet with a diameter of 298.4 mm and a thickness of 50 μm are prepared. Then, the large-sized, medium-sized, small-sized, medium-sized, and large-sized heat-resistant resin sheets are laminated in this order on the above electrostatic chuck, and this laminate is pressed and heated with the above-described method. The resin layer of the laminate and the cooling plate to which the above adhesive sheet is bonded are superposed to form an integrated unit while bringing the resin layer and the adhesive sheet into contact with each other, and the integrated unit is pressed and heated in the above-described method. Thus, a wafer holding table corresponding to a second embodiment is obtained.

The present invention is not limited to the above-described embodiments.

The present application claims priority from Japanese Patent Application No. 2018-45172 filed Mar. 13, 2018, the entire contents of which are incorporated herein by reference.

What is claimed is:

1. A wafer holding table, comprising a ceramic electrostatic chuck, a metal cooling plate, a resin layer having a predetermined thermal resistance, and a stress relaxation layer having a lower Young's modulus than the resin layer, the resin layer and the stress relaxation layer being disposed between the electrostatic chuck and the cooling plate, the resin layer being disposed closer to the electrostatic chuck, and the stress relaxation layer being disposed closer to the cooling plate, wherein
    the stress relaxation layer is a single layer having a thickness and the resin layer has a multilayer structure formed by laminating a plurality of resin sheets made of a same material one on another, with each of the resin sheets having a same thickness, such that the thickness of each resin sheet is less than the thickness of the stress relaxation layer,
    the resin layer is thinner than a comparative sample with a single-layer structure made of a material identical to a material of the resin sheet and having thermal resistance identical to thermal resistance of the resin layer, and
    a side surface of each resin sheet is exposed to a surrounding environment such that a side surface of the resin layer is recessed at a middle in a thickness direction or has a stepped shape in the thickness direction when the side surface of the resin layer is viewed in the thickness direction.

2. The wafer holding table according to claim 1, wherein the laminated plurality of resin sheets of the resin layer are three or more resin sheets.

3. The wafer holding table according to claim 2, wherein the laminated plurality of resin sheets of the resin layer are five or more resin sheets.

* * * * *